United States Patent
Anderson

(12) 
(10) Patent No.: US 6,515,260 B1
(45) Date of Patent: Feb. 4, 2003

(54) METHOD AND APPARATUS FOR RAPID HEATING OF NMR SAMPLES

(75) Inventor: Weston Anderson, Palo Alto, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 10/005,618

(22) Filed: Nov. 7, 2001

(51) Int. Cl.$^7$ ................................................ F27B 1/09
(52) U.S. Cl. ....................... 219/385; 219/390; 219/392
(58) Field of Search ................................ 219/385, 390, 219/406, 407, 409, 420, 421, 424, 426, 534; 373/111, 119

(56) References Cited

U.S. PATENT DOCUMENTS

| | | | | |
|---|---|---|---|---|
| 3,414,661 A | * | 12/1968 | Reed | 219/406 |
| 4,467,185 A | * | 8/1984 | Moritoki et al. | 219/390 |
| 4,748,315 A | * | 5/1988 | Takahashi et al. | 219/424 |
| 5,498,852 A | * | 3/1996 | Cress | 219/390 |
| 6,124,573 A | * | 9/2000 | Hall et al. | 219/407 |
| 6,295,834 B1 | * | 10/2001 | Driehuys | 62/637 |

OTHER PUBLICATIONS

Weber, J.B.W., "Apparatus Designed and Implemented," NMR Furnace, 1980s (http://wwwnmr.uk.ac.uk/~jbww/designs_h/designs_.html).*

Article by Wind, R.A. et al., entitled "Applications of Dynamic Nuclear Polarization in 13C NMR In Solids", published in Progress in NMR Spectroscopy, vol. 17, pp. 33–67, 1985.

Article by Farrar, C.T. et al., entitled "High–Frequency Dynamic Nuclear Polarization in the Nuclear Rotating Frame", published in Journal of Magnetic Resonance, vol. 144, pp. 134–141, 2000.

* cited by examiner

Primary Examiner—Joseph Pelham
(74) Attorney, Agent, or Firm—Bella Fishman

(57) ABSTRACT

An NMR sample, frozen in a tube and having achieved a specified higher degree of polarization for an NMR experiment, is rapidly heated and melted before it loses a significant portion of the achieved polarization and still retains 10% or more. The heating may be achieved by passing an electric current, or currents, through a heating wire, or wires, provided to the tube, or by placing the tube inside a furnace provided with an electric radiator. NMR experiments with high sensitivity can be carried out with such a sample still retaining a high level of polarization.

18 Claims, 3 Drawing Sheets

METHOD AND APPARATUS FOR RAPID HEATING OF NMR SAMPLES

BACKGROUND OF THE INVENTION

This invention relates to a method of rapidly heating a NMR sample and an apparatus for using such a method. More particularly, this invention relates to a method and an apparatus for heating an NMR sample to room temperature or above from an initial temperature which is sufficiently low for polarizing the sample to a desired degree within a time comparable to its thermal relaxation time.

There is a class of experiments in which it is desirable to rapidly heat a NMR sample from a very low temperature to room temperature or above. The degree of polarization normally achieved by a NMR sample is inversely proportional to the absolute temperature and proportional to the magnetic field strength. For example, the thermal polarization of a sample at a temperature of 3° K is 100 times greater than the polarization produced near room temperature, i.e. about 300° K. If the sample can be quickly warmed from 3° K to 300° K within a time period comparable to its thermal relaxation time, a high resolution NMR spectrum can be achieved with greatly enhanced sensitivity. To achieve the same sensitivity at room temperature would require a time period roughly $10^4$ times longer.

The solids effect can be achieved in solids containing electron radicals, i.e., unpaired electrons that are coupled to nearby nuclei. (See, for example, R. A. Wind et al., "Applications of Dynamic Polarization in $^{13}$C NMR in Solids", Progress in NMR Spectroscopy, Vol. 17, pp 33–67, 1985. In particular, see Sec. 2.3, The Solid State Effect). RF or microwave irradiation of the solid near the frequencies $v_e+v_n$ or $v_e-v_n$ causes simultaneous electron and nuclear spin flips, where $v_e$ is the electron Larmor frequency and $v_n$ is the nuclear Larmor frequency. The population redistribution results in an enhanced nuclear polarization. The enhancement can be substantial, approaching the ratio of $\gamma_e/\gamma_n$. For proton nuclei this ratio is approximately 650 and 3,400 for $^{13}$C.

By combining the two effects, i.e., achieving a high thermal polarizationation at low temperatures, using the solid effect to further enhance the nuclear polarization while at the low temperature, one can achieve a substantial nuclear polarization. By quickly warming the sample much of this polarization can be maintained even after the sample melts, enabling one to achieve very high sensitivity NMR experiments upon liquid samples. The nuclear relaxation time $T_1$ is a measure of how long this excess nuclear polarization time lasts. At low temperatures, near the initial temperature of the sample when it was polarized, the relaxation time is typically very long, several minutes to hours. As the sample melts, the relaxation time becomes much shorter, perhaps in the range of a second or less to tens of seconds. After the sample has been polarized to achieve an initial polarization $P_0$, the heating process is started. As the sample is heated it begins to lose some of its polarization. After a time $\tau$, the remaining excess polarization, P, is given by the approximate formula:

$$P=P_0 \exp\{-\int_0^\tau dt/T_1(t)\}$$

Using standard NMR procedures the relaxation time $T_1$ of the sample can be measured for various temperatures. The sample temperature can also be measured for various preselected heating times. Thus for a given experimental relaxation time, $T_1$, can be expressed as a function of time, $T_1=T_1(t)$, enabling one to integrate the expression above and obtain an estimate of the excess polarization. Typically the heating rate should be sufficiently rapid that ratio of excess polarization P to the initial polarization $P_0$ be down not more that a factor of 20, therefore $P/P_0>0.05$.

In a typical experiment, the analyte (material to be analyzed by NMR) is dissolved in a mixture of 40:60 solution of water/glycerol with the free radical 4-amino TEMPO as the source of electron polarization. (See C. T. Farrar et al., "High-Frequency Dynamic Nuclear Polarization in the Nuclear Rotating Frame", J. Magn. Resonance, Vol. 144, pp 134–141, 2000). As pointed out in this reference, other dynamic nuclear polarization techniques may also be used to polarize samples at low temperature.

The microwave sources used to produce the microwave transitions range from low cost solid state oscillators such as an impact diode or Gunn oscillators to high power gyrotron oscillator tubes such as manufactured by CPI.

Golman and Ardenkjaer-Larsen have suggested the method of quickly warming the sample by adding a hot solvent. This method, however, has the effect of diluting the sample further and does not permit repeated experiments with the same sample unless it is purified between successive spectral runs.

SUMMARY OF THE INVENTION

It is therefore an object of this invention to provide a method and an apparatus for using the solids effect to polarize a sample while it is very cold and then rapidly heating it to a liquid state near room temperature within a time sufficiently short to prevent substantial loss of polarization during the heating process so as to enable narrow line liquids NMR data to be taken while a high degree of polarization remains.

It is another object of this invention to provide such method and apparatus which will not dilute the sample being heated such that experiments can be repeated many times on the same sample.

In one embodiment of this invention, the sample is rapidly heated by radiation. This is achieved by rapidly moving the pre-polarized sample to the center of a furnace tube. Analysis shows that a 5 mm sample tube of water (4.2 mm ID) could be heated from 1° K to 303° K (30° C.) in about 14 seconds for a furnace tube operating at 1000° K (1273° C.). After a proper amount of heat is absorbed, the sample could be dropped into the NMR probe for analysis.

An alternative heating method involved using a sample tube with embedded heater wires that produce heat by passing a current through them. The heater section of the sample tube could be located at one end of the sample tube. With the sample initially at the upper end of the sample tube so that after the sample is heated and melted, the sample would collect at the lower end of the tube free of the heater wires. The melted sample is now placed in the NMR spectrometer for analysis.

The processes described above can be carried out automatically after the sample containing the free radical and solvent is once loaded into the sample tube and sealed.

BRIEF DESCRIPTION OF THE DRAWINGS

Throughout herein, components which are equivalent or at least alike may be indicated by the same numerals and may not necessarily be explained repetitively.

DETAILED DESCRIPTION OF THE INVENTION

Figure 1:
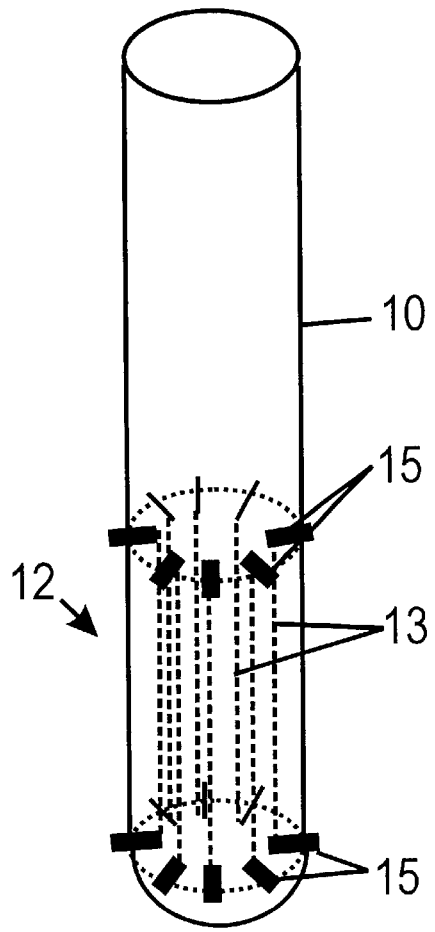
FIG. 1 is a schematic drawing of a heater sample tube which is a part of an apparatus embodying this invention.

The invention is described next by way of an example. A sample to be analyzed is added to a mixture of water and glycerol which also contains a free radical. FIG. 1 shows a special heater sample tube 10 embodying this invention into which this mixture is then placed. The sample tube 10 is characterized not only as having a closed bottom and a sealable top but also as containing therein a heating unit 12. The heating unit 12 typically comprises an array of heating wires 13 connected mutually in parallel such that they are all driven in parallel, thereby limiting so the voltage drop across the heating wires 13. Numeral 15 indicates metal posts penetrating the side of the sample tube 10 for supporting the wires 13. The heating wires 13 are selected so that their electrical resistance is sufficiently low and that little or no electrolysis of the sample material will take place. Alternatively, they may be coated with or contained in an electrically insulating material that has a high thermal conductivity such as very small sapphire tubes. The wires 13 of the heating unit 12 extend along the tube 10 and through about one third of its length from one end.

Figure 2:
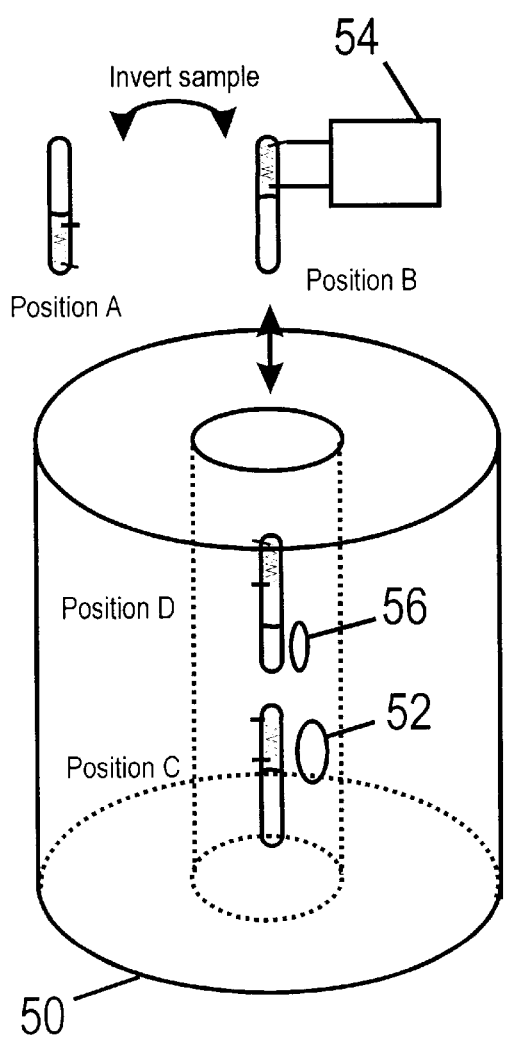
FIG. 2 is a schematic drawing showing an apparatus and a method embodying this invention, representing the heating unit of FIG. 1 only symbolically for convenience.

As the aforementioned mixture is put into the tube 10 held vertically upward (with the top above the bottom), say, to make it a little less than half full, the heating unit 12 is completely immersed in the mixture, and then the top of the tube 10 is sealed, as schematically shown at Position A in FIG. 2. (For the simplicity of presentation, the heating unit 12 is drawn simply as a single resistor in FIG. 2 in order to show only whether the tube 10 is right-side up or upside-down.) While at Position A, the sample inside the tube 10 is frozen such that it will stay at the bottom part of the tube 10 when the tube 10 is inverted, as shown at Position B in FIG. 2.

The inverted tube 10 containing the frozen sample at its bottom is moved from Position B to Position C inside a magnetic field established for producing the so-called dynamic nuclear polarization (DNP) effect, a magnet providing this magnetic field being indicated by numeral 50. At Position C, the sample, now being in a DNP region, is further cooled as a microwave field is applied to produce the DNP effect, a microwave radiator being indicated by numeral 52. The frequency of the microwave magnetic field is set equal to the difference between the electron resonance frequency and the resonance frequency of the nuclei to be polarized. In some applications, the microwave frequency is set to be equal to the electron resonance frequency, and in other applications the microwave frequency is set to equal the sum of the electron and the nuclear resonance frequencies.

After the high Boltzmann polarization of the electrons is transferred to the nuclei and the sample has become highly polarized, the sample is moved back to Position B where power is applied from a power source 54 to drive the wires 13 of the heating unit 12. Sufficient power is applied to sufficiently quickly melt the sample and to bring the liquid to a desired temperature within a short enough time with respect to the relaxation time of the nuclei, as discussed above. Since the tube 10 is kept in the inverted orientation, the melted liquid pools at the lower end (i.e., at the sealed top) of the tube 10.

The sample in the melted state is now quickly moved to Position D provided with an NMR probe coil 56 inside the magnetic field established by the magnet 50. Desired NMR experiments are carried out at Position D, with the tube 10 kept in the inverted orientation, until a large portion of the sample polarization is lost and the sample needs to be polarized again.

For repolarizing the sample, the sample is moved back to Position A and the process described above is repeated. After all the desired data have been taken, the sample may be manually removed in preparation of another experiment.

Although the method according to this invention was described above as if each step were to be carried out manually, an automatic sample handling system may be provided for carrying out the steps described above with reference to FIG. 2.

The implantation of the heater wires directly into the sample material provides a very rapid method of heating the entire sample in a uniform way. This is particularly advantageous when using large samples of 10 mm or more. For small sample tubes (particularly 3 mm or less), it is often sufficient to provide the heating by thermal contact through the sample tube wall by thermal radiation from a heating surface which does not make direct contact with the sample tube wall.

Figure 3:
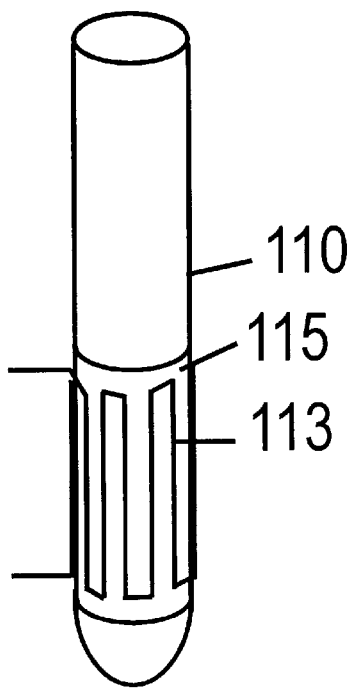
FIG. 3 is a schematic drawing of a heater sample tube structure embodying this invention with heat supplied by an external heating element in thermal contact with the sample tube.

In FIG. 3, which shows a heater sample tube structure, a heating element 113 is affixed onto a sample tube 110 such that heat flows directly from the heating element 113 through a thin support structure 115 to the outer surface of the sample tube 110. The heating element 113 forms a serpentine structure with vertical extent sufficient to heat the entire length of the sample material. The support structure 115 extends completely around the sample tube 113, thereby providing heat along the entire length and circumference of the sample material contained in the sample tube 110. The purpose of the support structure 115 is to support heating wires of the heating element 113.

Figure 4:
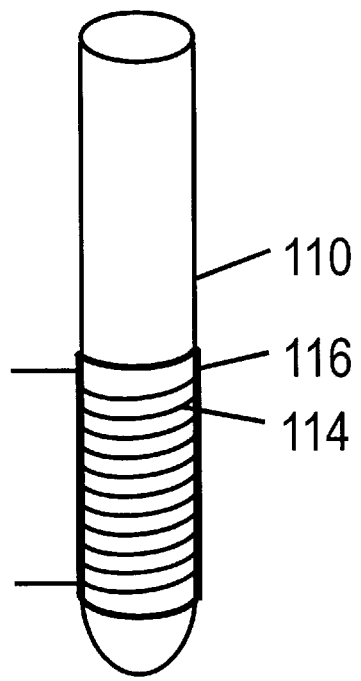
FIG. 4 is a schematic drawing of an alternative heater sample tube structure embodying this invention with heat supplied by an external heating element in thermal contact with the sample tube.

In FIG. 4, which shows another heater sample tube structure, a heating element 114 in the shape of a spiral coil is wound on a sample tube 110, affixed in place by means of a support structure 116. Alternatively, the heating element 114 may be wound directly on the sample tube 110. The heating element 114 may comprise a non-ferromagnetic conductor such as tantalum or tungsten, and may be in the form of round wires or thin flat wires. The sample tube 110 may be made of materials such as quartz, alumina, or sapphire. Sapphire has the advantage of providing extremely high thermal conductivity at low temperatures. Alumina has intermediate thermal conductivity, and quartz provides a lower thermal conductivity material at a lower cost.

Figure 5:
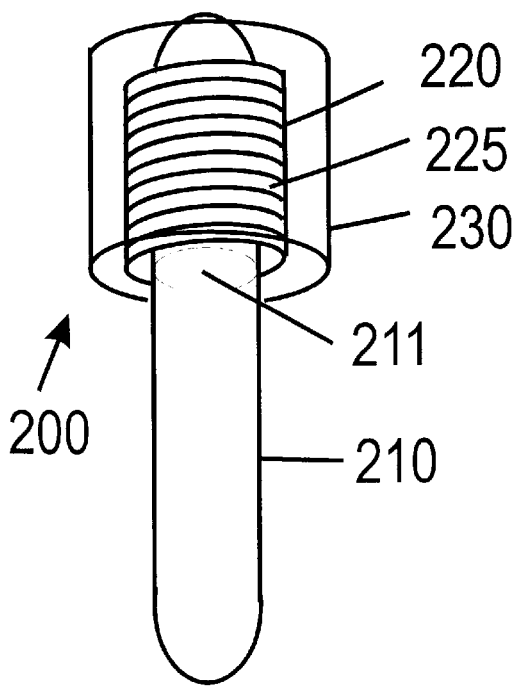
FIG. 5 is a schematic drawing of still another heater sample tube structure embodying this invention with heat supplied by an external heating element providing radiative heat to the sample material.

FIG. 5 shows still another heater sample tube structure with a sample tube 210 completely detached from a furnace 200, which contains an electrical heated radiator 220 with embedded electric heating element 225 and surrounded by a thermal radiation shield 230. During a sample heating process, the sample material 211 is in the furnace 200. The sample tube 210 is arranged such that the sample material 211 is centered within the walls of the thermal radiator 220. The radiator 220 is electrically heated to a high temperature, typically between 600° C. and 1500° C.

Thermal radiation from the radiator 200 is incident and absorbed by the sample, rapidly heating it. For the most part, the thermal radiation penetrates the sample tube walls and imparts heat directly to the sample material. As the sample melts, it pools in the lower part of the tube 210. The time required to heat the sample is estimated from the Stefan-Boltzmann equation $t=0.5\ h\rho d/(\epsilon \sigma T^4)$ where t is the time (in seconds) to heat the sample from its initial temperature to the desired final temperature, h is the total required heat in cal/gram of the sample, $\rho$ is the density of the sample in $g/cm^3$, d is the inner diameter of the sample cell in cm, $\epsilon$ is the emissivity of the sample, and $\sigma$ is the Stefan-Boltzmann constant (=$1.35 \times 10^{-12}$ (cal/sec)/$K^4\ cm^2$).

In operation, the heater-sample tube configuration of FIGS. 3, 4 and 5 may be used in the same manner as described above with reference to FIG. 1 and illustrated with the aid of FIG. 2.

Figure 6:
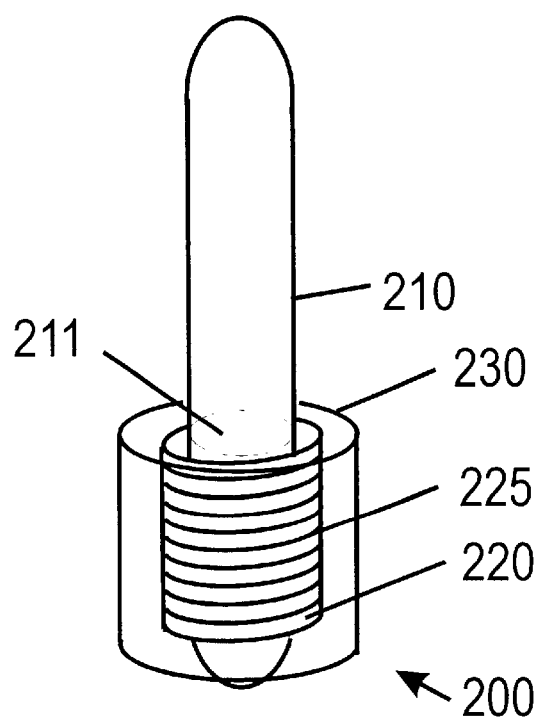
FIG. 6 is a schematic drawing of the heater sample tube structure of FIG. 5 being used in an alternative method embodying this invention.

An alternative mode of using the system shown in FIG. 5 is to keep the liquid and sold in the same region as the sample is melting. As shown in FIG. 6, a frozen sample 211 is contained in the lower region of the sample tube 210 as it is placed in the furnace 200. As the sample 211 is heated, the liquid and solid remain in contact until the entire sample 211 is melted. This makes for a somewhat simpler system for moving the sample between the various positions in the various steps of the experiment, as will be illustrated in FIG. 7.

Figure 7:
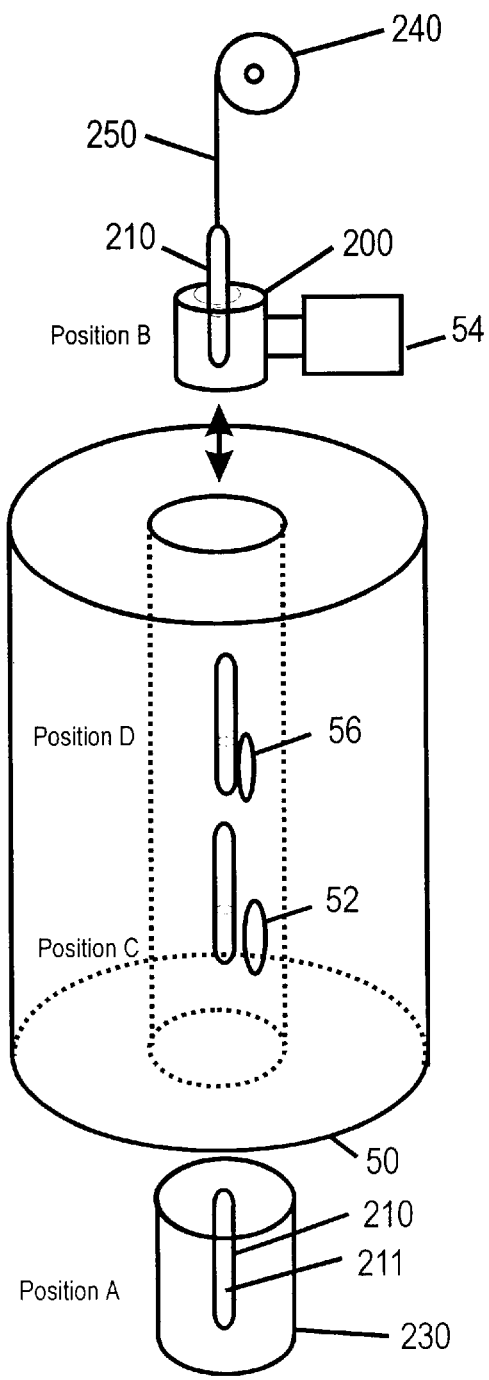
FIG. 7 is a schematic drawing of a sample tube heating apparatus embodying this invention.

FIG. 7 schematically illustrates a method of automatically cycling a sample 211 by moving through various positions. After the sample 211 is loaded into a sample tube 210 and the sample tube 210 is sealed, it is attached to one end of a wire or cord 250, the other end of the wire or cord 250 being wound on a spool 240. The spool 240 is turned by a stepping motor controlled by a computer (not shown), enabling the sample 211 to be moved to various positions required for carrying out various steps of the process to be described below. First, the sample 211 is lowered to Position A inside a cooling chamber 230. After the sample 211 becomes frozen and cooled to a desired starting temperature, it is raised to Position C where a microwave irradiator 52, which may comprise a wire or a microwave cavity, applies microwave radiation to the sample, thereby achieving the DNP. In some experiments, a radio frequency field may also be applied at this point. Additional cooling may be applied by an applicator (not shown) while the sample is being irradiated by microwaves. After the sample 211 is polarized, it is moved to Position B where the sample 211 is melted and brought to the temperature desired for NMR analysis. Power supply 54 supplies power to a furnace 200. The sample 211 is then quickly lowered to Position D where the desired NMR experiments are carried out with the aid of a coil 56. When the sample polarization becomes too small to be useful, the sample 21 is lowered to Position A again and the steps of the process described above are repeated.

Figure 8:
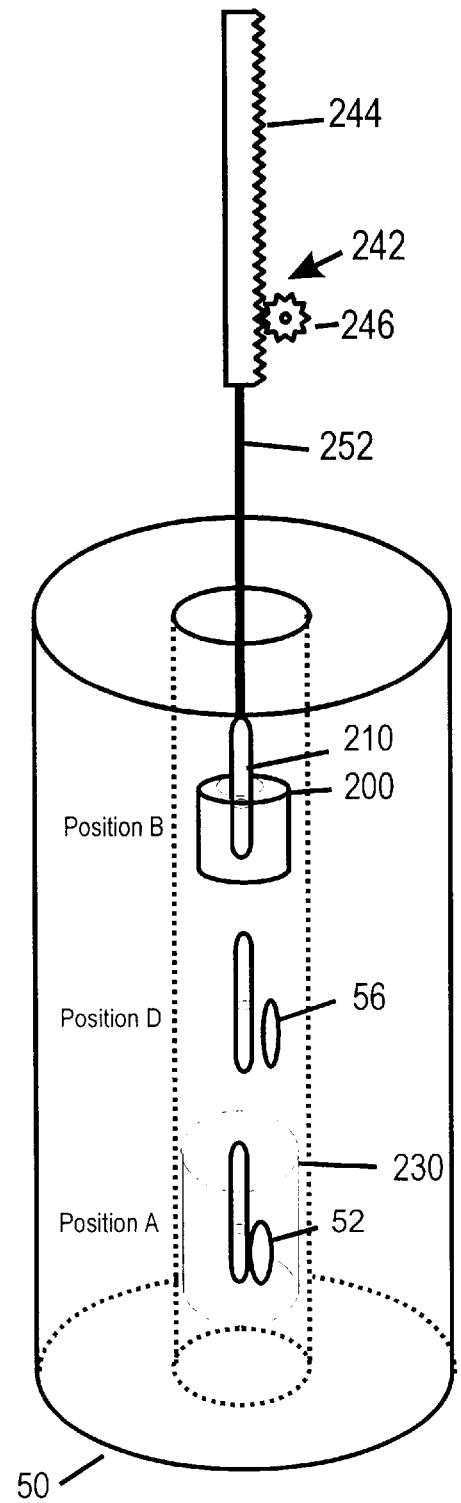
FIG. 8 is a schematic drawing for another sample tube heating apparatus embodying this invention.

FIG. 8 shows another embodiment of the invention different from the one described above with reference to FIG. 7 in that the cooling chamber 230 is brought inside the strong field of the magnet 50 and combined with the microwave irradiator 52 in the same region (indicated as Position A in FIG. 8) and also in that the furnace 200 containing the thermal radiator 220 is also brought into the field of the magnet 50. A thin metal or dielectric rod 252 or the wire or cord, 250 of FIG. 7 is used to support and move the sample to the various positions in place. One end of rod 252 is fixed to sample tube 210 and the other end fixed to the rack 244 of rack and pinion gear 242. The rack and pinion gear translates the linear motion required to move the sample to a rotary motion of pinion 246. Pinion 246 is coupled to a stepping motor, or a motor and a position encoder, not shown, to indicate and control the position of sample 210. The embodiment shown in FIG. 8 is preferable because it is advantageous to provide the rapid heating within the magnetic field since the sample polarization then decays toward the value determined by the magnetic field strength of the magnet 50 rather than by the earth's magnetic field strength. For the sake of clarity, the power source 54 of FIG. 7 is not shown in FIG. 8.

The invention has been described above with referenced to only a limited number of examples, but they are not intended to limit the scope of the invention. For example, in some cases it may be desirable to enclose the regions traversed by the sample and the sample positioning mechanisms within a vacuum tight enclosure, permitting a controlled atmosphere surrounding the sample tube. Many modifications and variations are possible within the scope of the invention, and the disclosure is intended to be interpreted broadly. In particular, where the heating of an NMR sample is said to be achieved rapidly, a time period of less than 30 seconds, and preferably less than 15 seconds, is intended and where a frozen sample is described as retaining a substantial amount of its achieved polarization while being heated by a method of this invention, the term "substantial amount" is intended to be understood as being 10% or more. This is because one of the main advantages to be gained by this invention is an increase in sensitivity in NMR experiments. Even if the gain in sensitivity is 10% of the maximum sensitivity gain achievable according to this invention, the time required for the experiment will be reduced by a factor of the order of 100, and it is indeed a significant advantage that would overcome the additional cost and complexity required to practice the present invention.

What is claimed is:

1. A method of rapidly heating an NMR sample, said method comprising the steps of:
    providing an NMR sample inside a tube, said NMR sample being frozen and having achieved a specified degree of polarization; and
    supplying power through said tube to thereby heat and melt said NMR sample within a heating time which sufficiently short such that said NMR sample retains about 10% or more of the amount of said achieved degree of polarization.

2. The method of claim 1 wherein said heating time is less than 30 seconds.

3. The method of claim 1 wherein said tube has a closed bottom part and a sealed top and is provided with one or more heating wires, said NMR sample being frozen inside at said bottom part of said tube; the step of supplying power including the steps of:
    placing said tube upside down such that said bottom part of said tube is higher than said sealed top; and passing electric currents through said heating wires, thereby melting said frozen sample within said heating time.

4. The method of claim 1 wherein said tube is provided with a plurality of wires and the step of supplying power includes the step of passing electric currents in parallel through said heating wires.

5. The method of claim 1 wherein said tube has a heating wire helically wound around said tube, the step of supply power including the step of passing an electric current through said heating wire.

6. The method of claim 3 wherein the step of providing an NMR sample includes the steps of:

holding said tube right-side up with said bottom part below said top before said sealed top is sealed and filling said tube in a normal temperature condition with said NMR sample in a liquid form to make said tube less than one half full;

sealing said tube to form said sealed top; and freezing said NMR sample in said bottom part of said tube by subjecting said NMR sample to a magnetic field and polarizing said NMR sample by applying radiative power.

7. The method of claim 6 which is followed by the steps of:

causing said melted NMR sample to drip down towards said sealed top while said bottom part is kept higher than said sealed top; and taking NMR data from said melted NMR sample.

8. The method of claim 7 which is further followed by the steps of:

setting said tube right-side up with said sealed top positioned higher than said bottom part; and freezing said melted NMR sample and repolarizing said NMR sample by again applying said radiative power.

9. The method of claim 6 wherein said radiative power is microwave power.

10. The method of claim 1 wherein the step of supplying power includes placing said tube containing said NMR sample inside a furnace with means for applying radiative power.

11. The method of claim 1 wherein said heating method includes an electrical radiator with an embedded electric heating element and a thermal shield around.

12. An apparatus for polarizing and rapidly heating a frozen NMR sample, said apparatus comprising:

a tube containing said frozen NMR sample, said tube having a closed bottom part and a sealable open top;

a magnet to polarize said frozen NMR sample to achieve a specified degree of polarization by providing magnetic field inside said tube; and heating means for heating and thereby melting said NMR sample inside said tube while said NMR sample still retains about 10% or more of the amount of said achieved degree of polarization.

13. The apparatus of claim 12 wherein said heating means heats and thereby melts said frozen NMR sample in 30 seconds or less.

14. The apparatus of claim 12 wherein said heating means comprises a furnace including an electrical radiator with an embedded electric heating element and a thermal shield around.

15. The apparatus of claim 14 wherein said heating method has a wall temperature between 600° C. and 1500° C.

16. The apparatus of claim 12 wherein said tube is provided with a plurality of heating wires connected in parallel and said heating means serves to pass electric currents in parallel through said heating wires.

17. The apparatus of claim 12 wherein said tube is provided with a heating wire which is helically wound around and said heating means serves to pass an electric current through said heating wire.

18. The apparatus of claim 12 further comprising a holding mechanism for holding said tube and carrying said tube to different specified locations.

* * * * *